(12) United States Patent  (10) Patent No.: US 9,091,707 B2
Chapman  (45) Date of Patent: Jul. 28, 2015

(54) SYSTEMS AND METHODS FOR VOLTAGE DETECTION

(71) Applicant: Hansen Enterprises II, LLC, Columbus, OH (US)

(72) Inventor: Brad Chapman, Columbus, OH (US)

(73) Assignee: Hansen Enterprises II, LLC, Columbus, OH (US)

( * ) Notice: Subject to any disclaimer, the term of this patent is extended or adjusted under 35 U.S.C. 154(b) by 0 days.

(21) Appl. No.: 13/864,769

(22) Filed: Apr. 17, 2013

(65) Prior Publication Data

US 2013/0278278 A1  Oct. 24, 2013

Related U.S. Application Data

(60) Provisional application No. 61/625,875, filed on Apr. 18, 2012.

(51) Int. Cl.
| | |
|---|---|
| *G01R 31/00* | (2006.01) |
| *G01R 19/00* | (2006.01) |
| *G01R 31/28* | (2006.01) |
| *G01R 29/08* | (2006.01) |
| *B66C 15/06* | (2006.01) |

(52) U.S. Cl.
CPC .......... *G01R 19/0084* (2013.01); *G01R 29/085* (2013.01); *G01R 29/0878* (2013.01); *G01R 31/2884* (2013.01); *B66C 15/065* (2013.01)

(58) Field of Classification Search
CPC .. B66C 15/065; G01R 29/085; G01R 19/145; G01R 19/0084

USPC ......................................... 324/66, 72, 207.22
See application file for complete search history.

(56) References Cited

U.S. PATENT DOCUMENTS

| | | | |
|---|---|---|---|
| 6,400,123 B1 * | 6/2002 | Bean et al. | 320/132 |
| 7,418,244 B2 * | 8/2008 | Montalvo | 455/127.2 |
| 2007/0018841 A1 * | 1/2007 | Nickerson | 340/685 |

OTHER PUBLICATIONS

SA614A Low power FM IF system, 1997, available at http://pdf.datasheetcatalog.com/datasheet/philips/SA614A_3.pdf.*
Model 2200L High Voltage Proximity Warning Device, Allied Safety Engineering, 2008, available at http://www.alliedsafetyeng.com/Documents/Model_2200L_Technical_Manual_Ver_1_2.pdf.*

* cited by examiner

*Primary Examiner* — Melissa Koval
*Assistant Examiner* — Daniel Miller
(74) *Attorney, Agent, or Firm* — Dinsmore & Shohl LLP

(57) ABSTRACT

Embodiments disclosed herein include systems and methods for voltage detection. One embodiment of a method includes receiving, at a voltage detection device, a power command, implementing a power conditioning stage, where the power conditioning stage provides power to electrical components of the voltage detection device, and performing an internal battery charge state built in test (BIT) function. Some embodiments include providing device function, control, sensing, signal processing, and user output functions, sampling a state of charge of a power supply of the voltage detection device, and outputting test result information. Still some embodiments include receiving, via an antenna of the voltage detection device, an indication of an ambient voltage and outputting a warning signal that identifies presence of the ambient voltage.

5 Claims, 8 Drawing Sheets

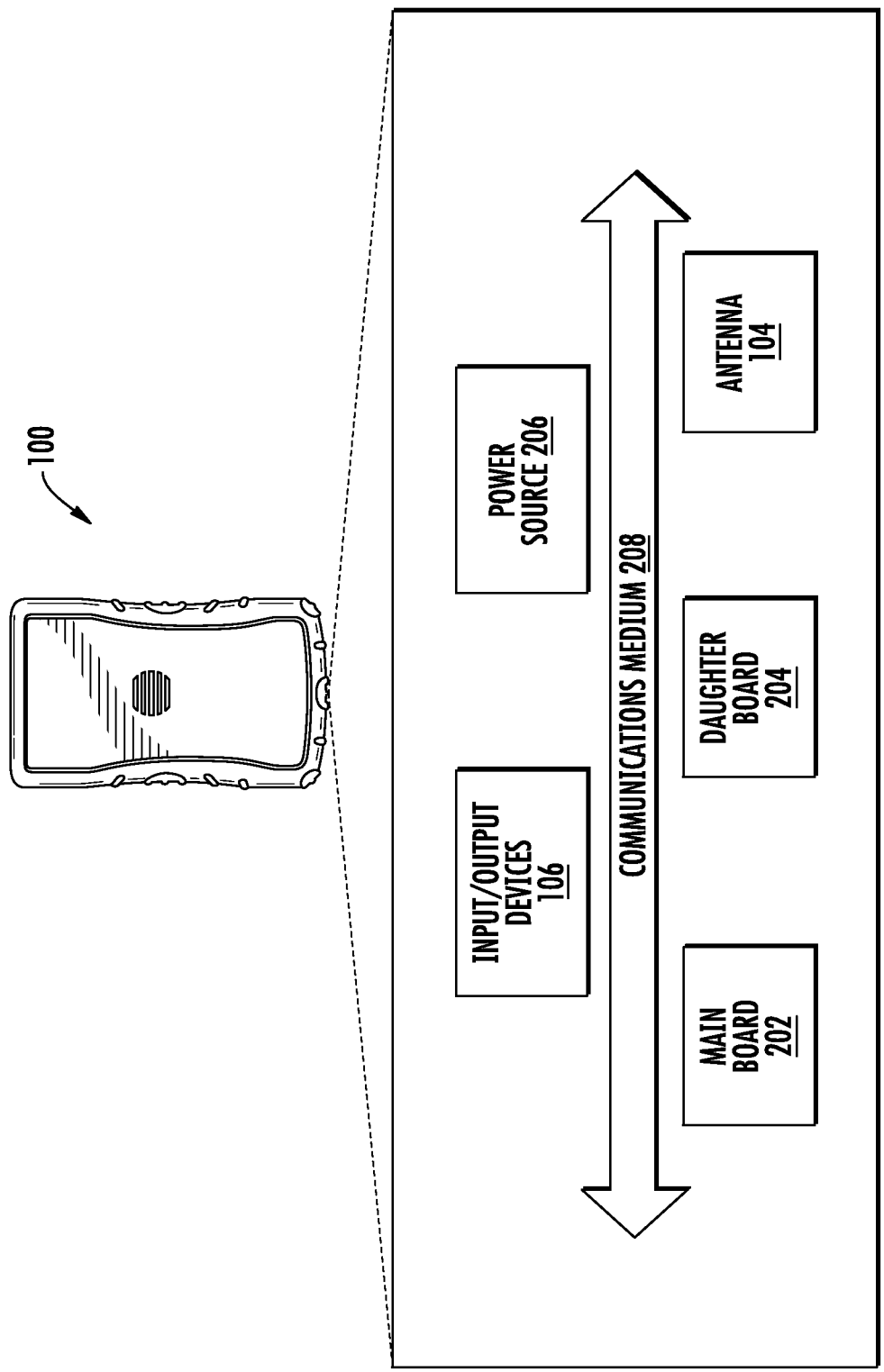

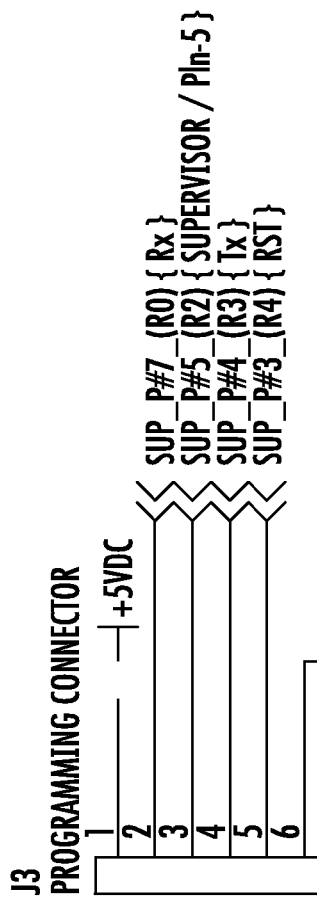
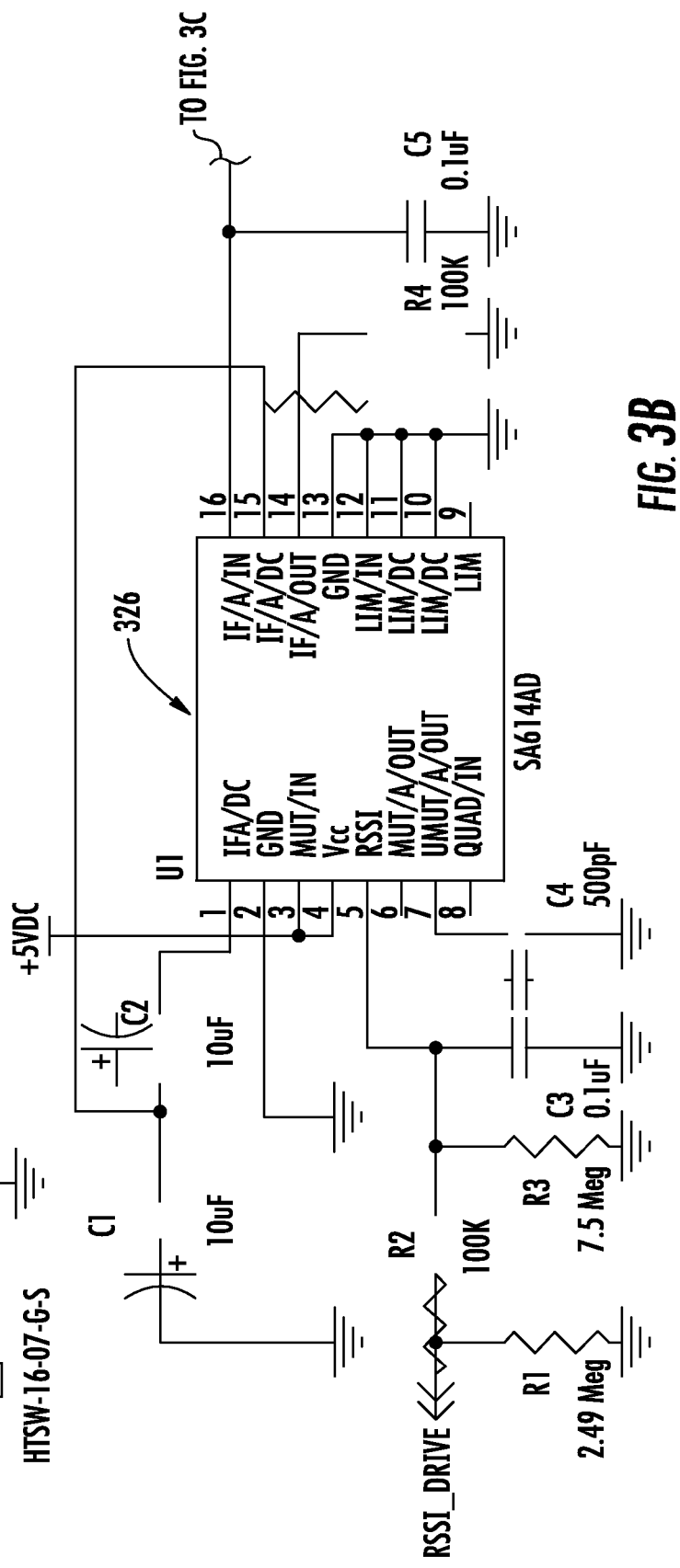
FIG. 3B

SYSTEMS AND METHODS FOR VOLTAGE DETECTION

CROSS REFERENCE

This application claims the benefit of U.S. Provisional Application No. 61/625,875, entitled Voltage Detection Device, filed Apr. 18, 2012, which is hereby incorporated by reference in its entirety.

TECHNICAL FIELD

Embodiments described herein generally relate to a voltage detection device and, more specifically, to a non-contact device that senses alternating current line voltages.

BACKGROUND

Many voltage detectors are configured as parallel connection devices. Specifically, if a voltage reading is desired across a point in a circuit, a voltage detector is generally connected in parallel with that point in the circuit. As voltage is equal across parallel segments of a circuit, such a configuration often yields accurate voltage readings. Problems exist however, when the voltage to be detected is ambient voltage, which is not associated with (or which radiates from) a physical circuit. As an example, when power lines are severed, live wires often produce large high voltage areas in the surrounding air. Because rescue workers and others may be required to enter that area to attend to victims, extinguish fires, and/or perform other actions, those rescue workers do not want to subject themselves to potentially dangerous voltage levels. As a result, voltage detection in the surrounding areas is desired.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which:

FIG. 2 schematically depicts components of the voltage detection device, according to embodiments disclosed herein;

FIGS. 3A-3D schematically depict various components of a main board of the voltage detection device, according to embodiments disclosed herein;

DETAILED DESCRIPTION

Embodiments disclosed herein include a voltage detection device, which includes a hand-held case assembly with installed logos, light pipe, and attendant hardware, a power supply (e.g., a battery), a main board, and a daughter board. The main board and daughter board may be printed circuit board configurations; however, this is not a requirement. Through these components, embodiments of the voltage detection device include a plurality of operational stage circuits, such as a signal amplifier stage circuit, a voltage processing stage circuit, a microprocessor processing stage circuit, and a device power conditioning stage circuit. With this hardware, software, and functional components, embodiments of the voltage detection device provide a non-contact electronic device that senses at a range from about 40 Hertz to about 70 Hertz alternating current (AC) line voltages and outputs visible and/or audible warning signals based on the detected line voltages.

Figure 1:
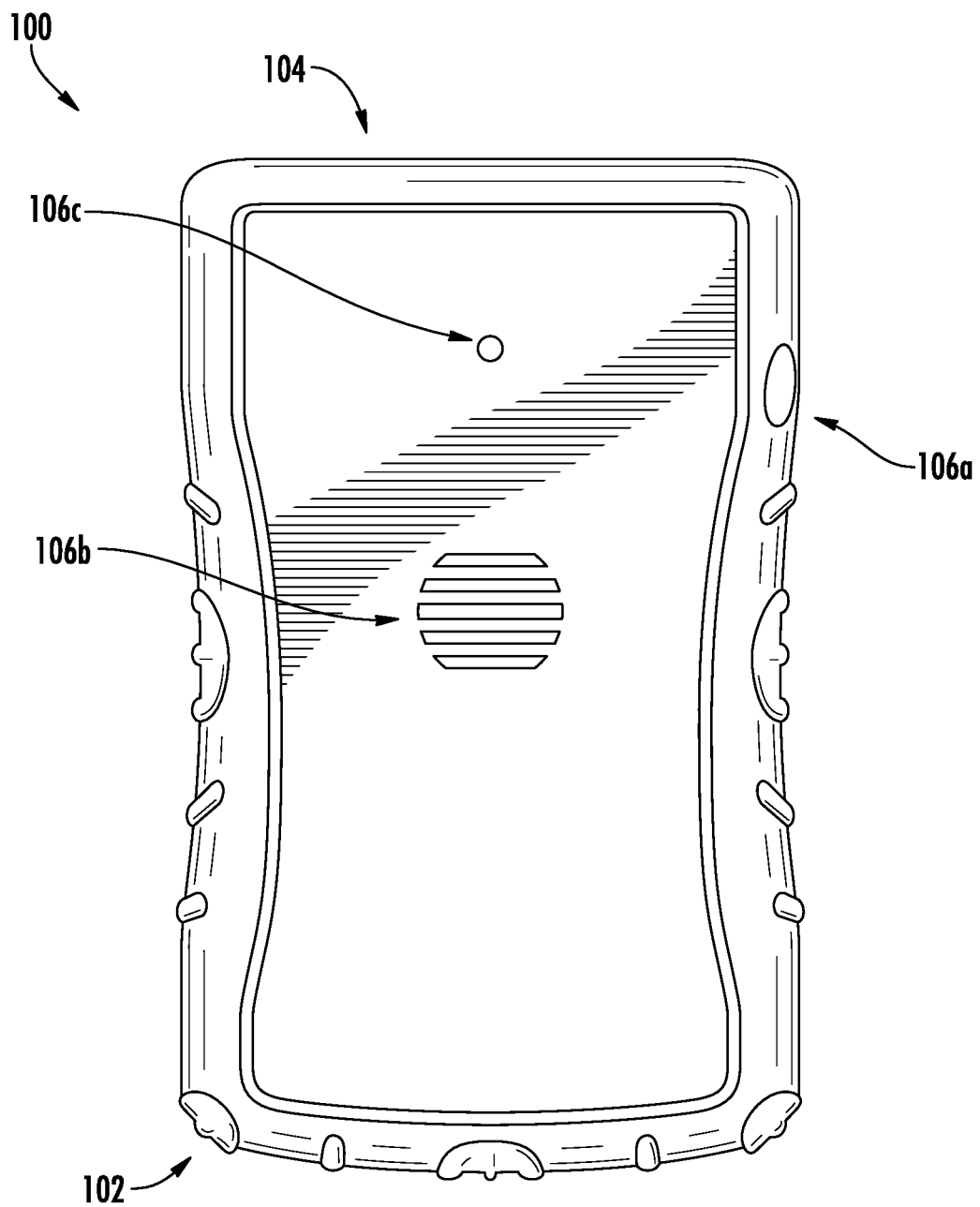
FIG. 1 schematically depicts an image of a voltage detection device, according to embodiments disclosed herein.

Referring now to the drawings, FIG. 1 schematically depicts a voltage detection device 100, according to embodiments disclosed herein. As illustrated, the voltage detection device 100 includes an exterior portion 102, an antenna 104, and one or more input/output devices 106. The exterior portion 102 may include a protective cover, shell, and/or other device for protecting the internal components of the voltage detection device 100. Additionally, the antenna 104 may be configured for detecting about 40 Hertz to about 70 Hertz of AC line voltages. The antenna 104 may include and/or be coupled to a double sided printed circuit board (PCB) and an attendant connector pin field. The antenna 104 may utilize solid metal planes on each of the PCB to receive radiated AC fields to accumulate a charge from the fields and supply a readable imposed voltage to the amplifier stages discussed below.

Additionally, the input/output devices 106 may include a power option 106a and an output device. The output device may include a speaker 106b and/or visual display device 106c, each for providing a visual display and/or warning signal. The power option 106a may include a power button, slide switch, or other device for receiving a power command and thus activating and/or deactivating the voltage detection device 100. The speaker 106b may include any audio producing device, such as a miniature, waterproof polyethylene coned micro-speaker or enunciator that is capable of about a 95 decibel audio response (alarm output). The speaker 106b may be configured to provide audio alerts, based on a predetermined threshold of detected AC line voltage. Similarly, the visual display device 106c may be configured as a light emitting diode (LED), liquid crystal display (LCD), and/or other visual indicator for alerting a user of in-line voltages that meet a predetermined threshold. Thus, when the voltage detection device 100 receives an indication of an ambient voltage, the speaker 106b and/or the visual display device 106c may activate.

FIG. 2 schematically depicts components of the voltage detection device 100, according to embodiments disclosed herein. As illustrated, the voltage detection device 100 may include the input/output devices 106, a main board 202, a daughter board 204, and the antenna 104. A power supply 206 is also provided and may be embodied as a battery or other power supply. These devices may be coupled to each other via a communications medium 208, which may be configured as a wire, bus, or other medium for facilitating communication among the various components of the voltage detection device 100. It should be understood that while many of the features depicted herein are described as being implemented by circuitry, these are merely examples. In some embodiments, the circuitry may be implemented via firmware, software, and/or another type of non-transitory computer-readable medium. In some embodiments, the circuitry is implemented via instructions stored on a non-transitory computer-readable medium and executed by a processor.

Figure 3A:
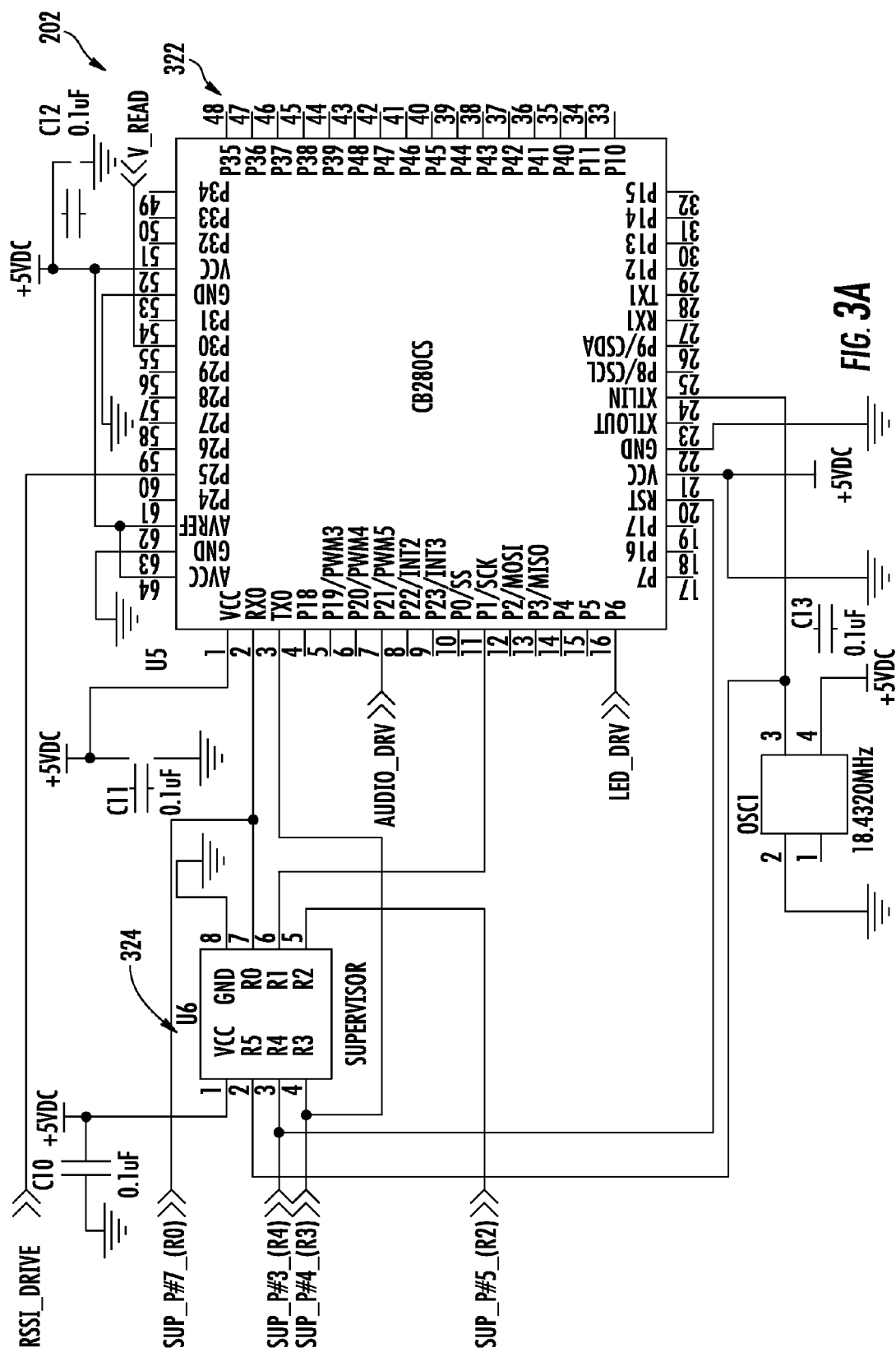

FIGS. 3A-3D schematically depict various components of a main board 202 of the voltage detection device 100, according to embodiments disclosed herein. As illustrated, the main board 202 may include a processor 322 and/or other components for providing the functionality described herein. The processor 322 may include a plurality of inputs and/or outputs and may be connected to a supervisor component. The processor depicted in FIG. 3A includes a 64-pin configuration, but other configurations may also be implemented. Similarly, the supervisor component is depicted in FIG. 3A as including an 8-pin configuration. This also is merely an example.

Figure 3C:
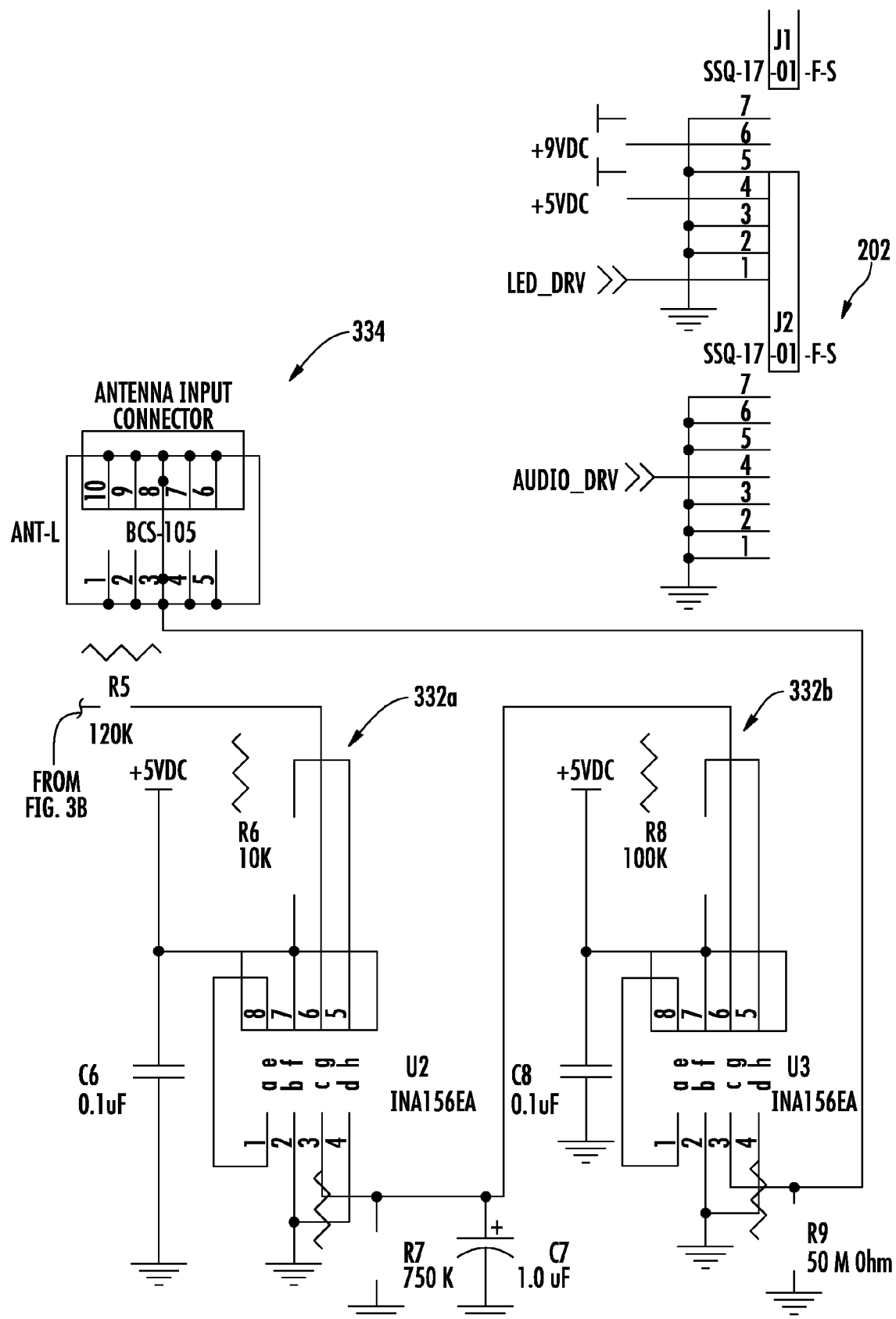
Figure 3D:
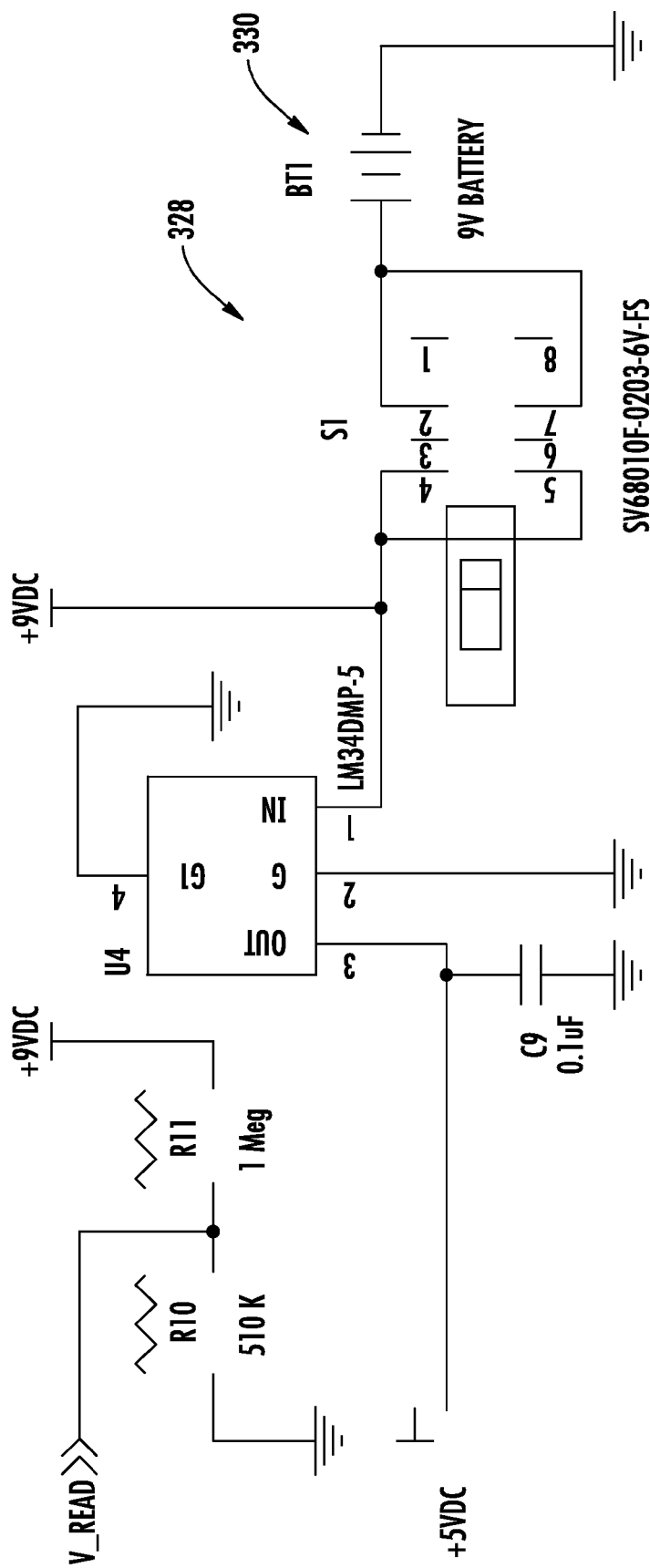

Referring specifically to FIGS. 3B-3D, the main board 202 may also include a frequency modulated (FM) intermediate frequency (IF) system component 326. The FM IF system component 326 is depicted as a 16-pin component, but this is also just an example. FIG. 3B also includes an 8-pin slide switch 328, a power supply 330, amplifiers 332a, 332b, an antenna input connector 334, and/or other components for performing the functionality described herein.

Figure 4:
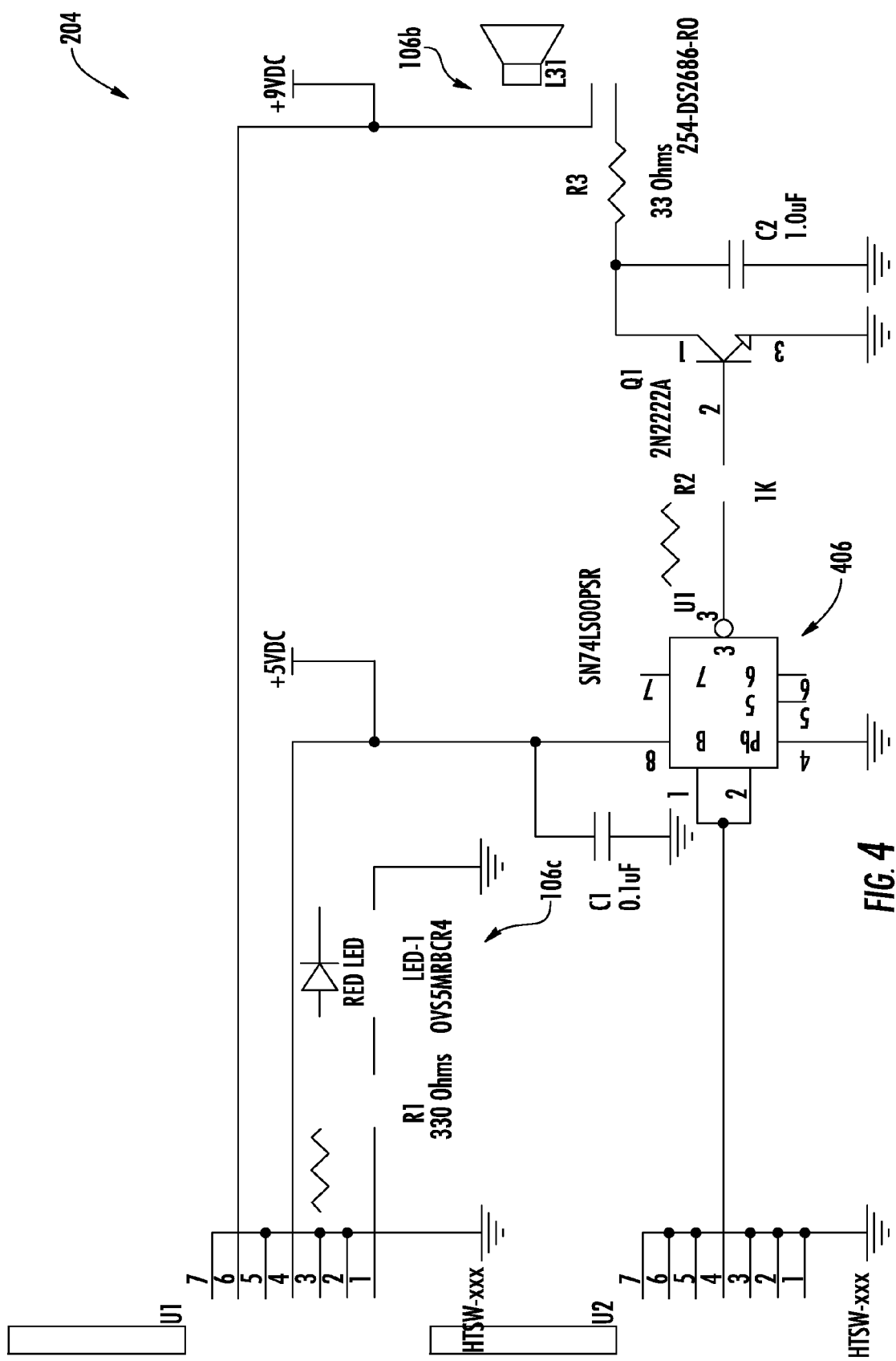
FIG. 4 schematically depicts various components of a daughter board of the voltage detection device, according to embodiments disclosed herein.

FIG. 4 schematically depicts various components of a daughter board 204 of the voltage detection device 100, according to embodiments disclosed herein. As illustrated, the daughter board 204 may include one or more components, such as the speaker 106b and the visual display device 106c. Also included is a logic gate component 406, and/or other components, such as transistors, resistors, capacitors, etc.

It should be understood that while the daughter board 204 is depicted in FIG. 4, this is merely an example. Some embodiments only include a single circuit board for providing the functionality herein.

Figure 5:
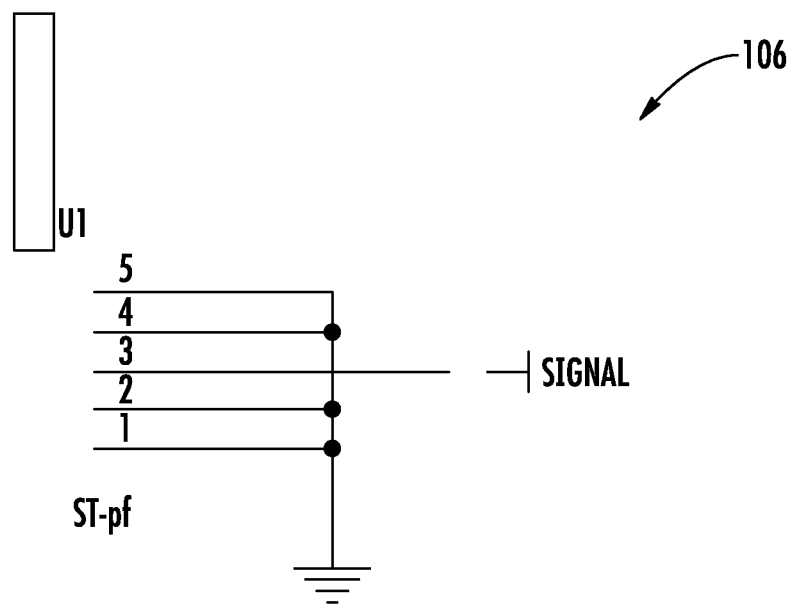
FIG. 5 schematically depicts various components of an antenna of the voltage detection device, according to embodiments disclosed herein.

FIG. 5 schematically depicts various components of an antenna 104 of the voltage detection device 100, according to embodiments disclosed herein. As described above, the antenna 104 may be coupled to the main board 202 and/or the daughter board 204 and may be configured for detecting in line AC voltages.

Specifically, the main board 202, the daughter board 204, and/or the antenna 104 may be configured to provide a plurality of operational stages. As an example, the voltage detection device 100 may include a signal amplifier stage circuit, a voltage processing stage circuit, a microprocessor processing stage circuit, a device power conditioning stage circuit, and/or other stages. The signal amplifier stage circuit may include an amplifier on the main board 202 and/or daughter board 204 that includes a plurality of high temperature stability, ultra low noise amplifiers. The amplifiers may be coupled to filtering elements to eliminate ultra low frequencies (such as less than about 40 Hertz) and very low frequencies (such as greater than about 70 Hertz). These amplifier gains may be adjusted to very high gain levels to accommodate the sensing of low sensed AC field signal strength accomplishing high sensitivities of near and far fields.

Similarly, the voltage processing stage may utilize a custom integrated circuit block that converts amplified half wave AC signal into a fully rectified direct current (DC) signal via an internal full wave rectification bridge for further signal processing. Another functional element of the processing stage circuitry includes 5 in-line stages of logarithmic amplification to add additional gain to the pre-processed DC signal. The voltage processing stage circuitry may also include a high precision logarithmic voltage to current converter circuit that converts the processed DC signal into a measurable DC. Another element of the voltage processing stage circuitry includes a received signal strength indicator (RSSI) subsection that effectively acts as a precise, low thermal drift signal strength meter that provides the processor 322 and related subsections analog to digital converter to measure and provide analog input/outputs to drive the input/output devices 106 to provide the user with situational cues as to the proximity of the detected AC fields.

Similarly, the microprocessor processing stage may include the processor 322 from FIG. 3. The processor 322 may execute software that causes the processor 322 to measure the pre-signal conditioned DC signal, utilizing an analog to digital converter capable of providing about 1023 measurement steps of the incoming preconditioned DC signal level provided by the RSSI section of the voltage processing stage. The processor 322 may provide a plurality of functional attributes, such as an internal battery charge state built in test (BIT) function component for testing a current state of a power supply, an audible alarm annunciation function, and a visual alarm indicator function.

The internal battery charge state BIT function component may include a dedicated analog to digital converter channel that reads the charge state and voltage level of the power supply at system startup. The BIT function additionally indicates if the voltage detection device 100 is in an acceptable operational state by providing a predetermined output. As an example, the BIT function can output a continually repeating audible alarm that indicates the power supply state meets a predetermined threshold. As another example, the BIT function can rapidly output visual and audible alarms that indicate that the voltage detection device 100 has passed a self-test cycle.

Similarly, the audible alarm annunciation function may include the speaker 106b from FIG. 1. As discussed above, the speaker 106b may include a miniature, waterproof polyethylene coned micro-speaker that is capable of about a 95 decibel audible alarm output. The audible output provides audible cues to the user as to the relative proximity and/or location of a detected AC source. The visual alarm indicator function utilizes the visual display device 106c from FIG. 1, such as a high brightness red optical LED to provide a visual response, such as a warning signal (e.g., flashing for 5 seconds) to the user as to the relative proximity and/or location of a detected AC source. The LED indicator may be focus transparent light-pipe affixed through the wall of the external portion 101 (also FIG. 1).

Embodiments of the device power conditioning stage includes a master power switch, the power supply, a high quality, low thermal drift voltage regulator circuitry, and attendant noise filtering components that provide electronic circuitry of the device a stable, clean power supply.

In operation, the voltage detection device 100 is powered on by a user selecting the power option 106a (FIG. 1). The power conditioning stage may be implemented and provides power to the electrical components of the voltage detection device 100. The processor 322 (FIG. 3) boots and performs the internal battery charge state BIT function. The processor 322 initializes the firmware control software to provide device function, control, sensing, signal processing, and user output functions. The processor 322 then samples the state of charge of the power supply 206 and outputs test result information via an audible and/or visual output, as described above.

As illustrated above, various embodiments of the voltage detection device 100 are disclosed. These embodiments provide a mechanism for a user to determine the location, direction, intensity, and/or other parameters of a voltage source that could cause harm to those in the vicinity. This voltage detection device 100 may be operated without physical connection to the source of the ambient voltage, thereby allowing the user to detect the voltage from a safe distance.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

What is claimed is:

1. A device, comprising:
  a hand-held case;
  a voltage detection circuit contained within the hand-held case, the voltage detection circuit comprising:
    an antenna for detecting ambient voltage from a source of AC line voltage proximate the device, the ambient voltage being transmitted from the source of AC line voltage through air to the antenna; and
    circuitry that is coupled to the antenna and includes a main board and a daughter board, wherein the main board couples to the antenna via an antenna input connector, wherein the main board comprises a processor for receiving an indication of the ambient voltage, wherein the antenna utilizes solid metal planes on sides of the main board to receive the ambient voltage that accumulate a charge for determining the ambient voltage, wherein the main board further comprises: a power supply for supplying power to components of the device, an amplifier for amplifying an ambient voltage detected by the antenna, and a frequency modulated (FM) intermediate frequency (IF) system component for receiving an output from the amplifier and outputting the indication of the ambient voltage in the form of a received signal strength indicator (RSSI) signal, and wherein the daughter board comprises an output device for outputting the indication of the ambient voltage to a user of the device;
  wherein the voltage detection circuit detects the ambient voltage in a range of about 40 Hertz to about 70 Hertz; and
  wherein the processor implements an internal battery charge state built in test (BIT) function component for testing a current state of the power supply, wherein the internal battery charge state BIT function component comprises a dedicated analog to digital converter channel that reads a charge state and voltage level of the power supply at device startup.

2. The voltage detection device of claim 1, wherein the output device comprises a visual display device for providing a visual response to detection of the ambient voltage.

3. The voltage detection device of claim 1, wherein the output device comprises a speaker for providing an audio response to detection of the ambient voltage.

4. The voltage detection device of claim 1, wherein the circuitry is configured as a plurality of operational stage circuits, including at least two of the following: a signal amplifier stage circuit, a voltage processing stage circuit, a microprocessor processing stage circuit, and a device power conditioning stage circuit.

5. The voltage detection device of claim 1, wherein the output device provides cues to indicate a location of a source of the ambient voltage.

* * * * *